United States Patent [19]
Noda

[11] Patent Number: 5,692,297
[45] Date of Patent: Dec. 2, 1997

[54] METHOD OF MOUNTING TERMINAL TO FLEXIBLE PRINTED CIRCUIT BOARD

[75] Inventor: Haruo Noda, Yokkaichi, Japan

[73] Assignee: Sumitomo Wiring Systems, Ltd., Japan

[21] Appl. No.: 551,174

[22] Filed: Oct. 31, 1995

[30] Foreign Application Priority Data

Nov. 25, 1994 [JP] Japan ................................ 6-291530
Nov. 25, 1994 [JP] Japan ................................ 6-291531

[51] Int. Cl.⁶ .............................................. H01R 9/00
[52] U.S. Cl. ........................... 29/845; 29/840; 228/180.1; 228/212
[58] Field of Search ....................... 29/840, 842, 843, 29/845; 228/180.1, 212, 215, 49.5, 175; 439/66, 77

[56] References Cited

U.S. PATENT DOCUMENTS

| | | | |
|---|---|---|---|
| 4,216,350 | 8/1980 | Reid | 228/246 |
| 4,842,184 | 6/1989 | Miller, Jr. | 228/180.1 |
| 5,092,035 | 3/1992 | McMichen et al. | 29/843 |
| 5,326,936 | 7/1994 | Taniuchi et al. | 439/876 |
| 5,373,786 | 12/1994 | Umaba . | |

FOREIGN PATENT DOCUMENTS

346228  12/1989  European Pat. Off. .

Primary Examiner—P. W. Echols
Assistant Examiner—Adrian L. Coley
Attorney, Agent, or Firm—Jordan B. Bierman; Bierman, Muserlian and Lucas LLP

[57] ABSTRACT

For soldering a terminal (14) to a land (13) formed on an FPC (12) made of a material having a softening point below 230° C., such as PET, by using a flow soldering or reflow soldering technique, an opening (17) larger than the land (13) is formed in a thermal insulation holder (11) including a phenolic paper base copper clad laminate board or the like so that the land (13) and the terminal (14) are within sight, and the thermal insulation holder (11) is held in contact with a surface of the FPC (12) to which solder is applied so that the land (13) and the terminal (14) are located within the opening (17) to perform the soldering using the flow soldering or reflow soldering technique, whereby molten solder readily reaches the land (13) through the opening (17) which need not be worked into a conventional trapezoidal configuration in vertical section, thereby preventing poor soldering. (FIG. 1)

20 Claims, 7 Drawing Sheets

METHOD OF MOUNTING TERMINAL TO FLEXIBLE PRINTED CIRCUIT BOARD

BACKGROUND OF THE INVENTION

1. Field of the Invention

The present invention relates to a method of mounting a terminal to a flexible printed circuit board and, more particularly, to a method of soldering a terminal to a land formed on a flexible printed circuit board made of a material having a softening point below 230° C.

2. Description of the Background Art

Flow soldering and reflow soldering techniques using conventional solder are not applicable to a flexible printed circuit board (referred to hereinafter as an FPC) having a substrate made of polyethylene terephthalate (referred to hereinafter as PET) since the softening point of PET ranges from 220° C. to 230 ° C. which is substantially equal to the melt temperature of the conventional solder.

Soldering by local heating using solder having a low melting point below 200° C. may be considered but presents the problems of costs and safety depending on the types of materials to be added to lower the melting point of the solder.

Figure 13:
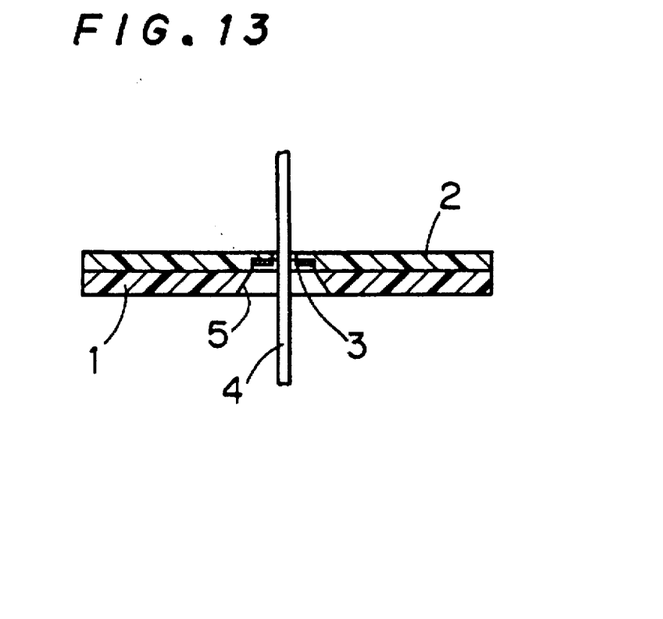
FIG. 13 is a cross-sectional view of the background art.

An approach for soldering a terminal to a land on the FPC without using low-melting-point solder has been proposed which is disclosed in Japanese Patent Application Laid-Open No. 5-218632 (1993). Referring to FIG. 13, a thermal insulation holder 1 including a phenolic paper base copper clad laminate board, a paper base epoxy resin board, or a glass fabric base epoxy resin board is prepared. A land 3 is formed on a FPC 2 made of PET, and a terminal 4 is received through the FPC 2 generally centrally of the land 3. An opening 5 which is substantially equal in size to the land 3 is then formed in the thermal insulation holder 1. The thermal insulation holder 1 is brought into contact with a surface of the FPC 2 to which solder is applied so that the land 3 and the terminal 4 are located within the opening 5. With the contact maintained, soldering is performed.

To facilitate the introduction of solder into the opening 5, the opening 5 is designed to be equal in size to the land 3 on its contact surface side and to be greater than the land 3 on the opposite side thereof. That, is, the opening 5 is of a trapezoidal configuration in vertical section.

Figure 14:
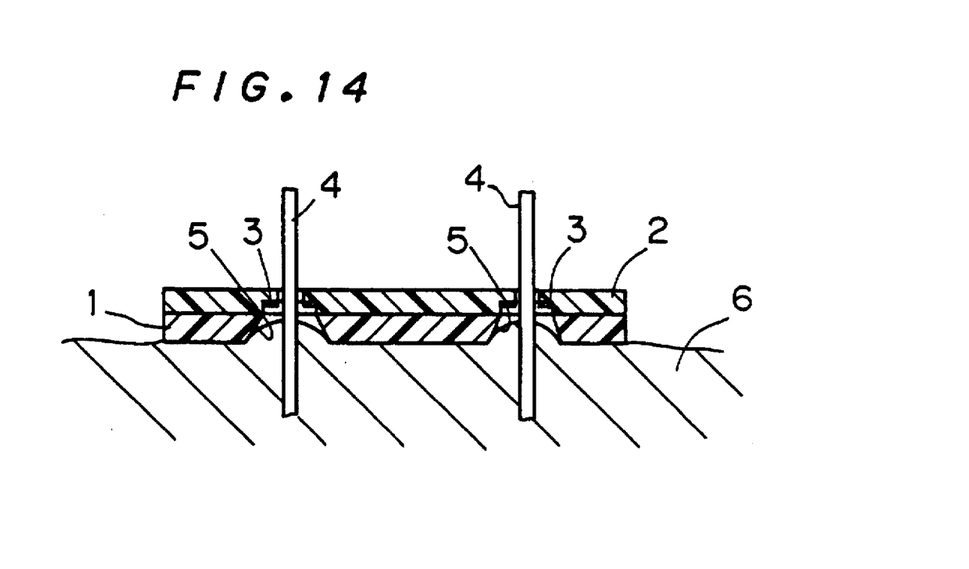
FIG. 14 illustrates the operation of the background art.

In the disclosed method, however, the opening 5 formed in the thermal insulation holder 1 has the size similar to that of the land 3 on the FPC 2 and is very small. Thus, when the FPC 2 is brought into contact with molten solder 6 in a solder tank, with the thermal insulation holder 1 positioned downside, to perform soldering, the solder 6 does not reach the land 3 due to the surface tension of the molten solder 6 in some cases, resulting in poor soldering.

Soldering a multiplicity of terminals such as connector terminals requires an equal number of lands and, accordingly, a large number of openings corresponding to the respective lands. Thus, fabrication of a multiplicity of openings of a trapezoidal cross-sectional configuration adds to the number of fabrication steps and fabrication costs.

SUMMARY OF THE INVENTION

A first aspect of the present invention is intended for a method of mounting a terminal made of a conductive material to a flexible printed circuit board made of a material having a softening point below 230° C. by soldering the terminal to a land formed on the flexible printed circuit board. According to the present invention, the method comprises the steps of: forming an opening larger than the land in a flat thermal insulation holder, the thermal insulation holder being to come into contact with a surface of the flexible printed circuit board to which solder is applied; and bringing the thermal insulation holder into contact with the surface of the flexible printed circuit board so that the land and the terminal are located within the opening to solder the terminal by a flow soldering or reflow soldering process, with the contact maintained.

A second aspect of the present invention is intended for a method of mounting a plurality of terminals made of a conductive material to a flexible printed circuit board made of a material having a softening point below 230° C. by soldering the terminals to a plurality of lands formed on the flexible printed circuit board, respectively. According to the present invention, the method comprises the steps of: forming a rectangular opening slightly larger than a minimum rectangle defined to surround a row of the lands in a thermal insulation holder, the thermal insulation holder being to come into contact with a surface of the flexible printed circuit board to which solder is applied; and bringing the thermal insulation holder into contact with the surface of the flexible printed circuit board so that the lands and the terminals are located within the opening to solder the terminals by a flow soldering or reflow soldering process, with the contact maintained.

Preferably, according to a third aspect of the present invention, the thickness of the thermal insulation holder is about one-tenth to seven times the thickness of the flexible printed circuit board.

A fourth aspect of the present invention is intended for a method of mounting a terminal made of a conductive material to a flexible printed circuit board made of a material having a softening point below 230° C. by soldering the terminal to a land formed on the flexible printed circuit board. According to the present invention, the method comprises the steps of: forming a through aperture having a size substantially equal to the size of the land in a thermal insulation film provided in contact with a surface of the flexible printed circuit board to which solder is applied; forming an opening larger than the land in a thermal insulation plate, the thermal insulation plate being to come into contact with a surface of the thermal insulation film which is opposite from the flexible printed circuit board; and soldering the terminal by a flow soldering or reflow soldering process, with the thermal insulation film in contact with the surface of the flexible printed circuit board so that the land and the terminal are located within the through aperture and with the thermal insulation plate in contact with the surface of the thermal insulation film so that the land and the terminal are located within the opening.

Preferably, according to a fifth aspect of the present invention, the thermal insulation plate is provided with a plurality of guide pins in corners thereof, and the flexible printed circuit board and the thermal insulation film have through apertures formed therein for the guide pins; and the guide pins are respectively inserted into the through apertures to bring the thermal insulation plate into contact with the thermal insulation film and to bring the thermal insulation film into contact with the flexible printed circuit board.

Preferably, according to a sixth aspect of the present invention, the guide plate is formed with a guide frame for receiving the flexible printed circuit board and the thermal insulation film therein; and the thermal insulation film comes into contact with the flexible printed circuit board, and the thermal insulation plate comes into contact with the thermal insulation film.

According to the first aspect of the present invention, the opening of the thermal insulation holder is larger than the land on the flexible printed circuit board to permit molten solder to readily reach the land through the opening, preventing the occurrence of poor soldering. The opening need not be worked into a conventional trapezoidal configuration in vertical section, thereby simplifying the step of forming the opening in the thermal insulation holder.

According to the second aspect of the present invention, the formation of one opening slightly larger than the minimum rectangle defined to surround the row of lands in the thermal insulation holder enables the soldering of the plurality of connector terminals by using the flow soldering or reflow soldering process.

According to the third aspect of the present invention, the thickness of the thermal insulation holder is one-tenth to seven times the thickness of the flexible printed circuit board. The short distance between the surface of the molten solder and the land allows the molten solder to readily reach the land through the opening, preventing the occurrence of poor soldering.

According to the fourth aspect of the present invention, the thermal insulation film is provided in contact with the solder-applied surface of the flexible printed circuit board, and the thermal insulation plate is provided in contact with the surface of the thermal insulation film opposite from the flexible printed circuit board. The provision of the thermal insulation film between the flexible printed circuit board and the thermal insulation plate prevents the deterioration of the thermal insulation effects in the case of the thin thermal insulation plate to perform the soldering by using the flow soldering or reflow soldering process. Further, the molten solder may readily reach the land through the opening and through aperture, preventing the occurrence of poor soldering.

The contact between the thermal insulation plate and the thermal insulation film and the contact between the thermal insulation film and the flexible printed circuit board may be readily made by inserting the plurality of guide pins formed in the corners of the thermal insulation plate into the through apertures for the respective guide pins formed in the flexible printed circuit board and thermal insulation film in accordance with the fifth aspect of the present invention, or by forming the guide frame on the thermal insulation plate for receiving the flexible printed circuit board and the thermal insulation film therein.

It is therefore an object of the present invention to prevent the occurrence of poor soldering without difficulty.

These and other objects, features, aspects and advantages of the present invention will become more apparent from the following detailed description of the present invention when taken in conjunction with the accompanying drawings.

DESCRIPTION OF THE PREFERRED EMBODIMENTS (First Preferred Embodiment)

Figure 1:
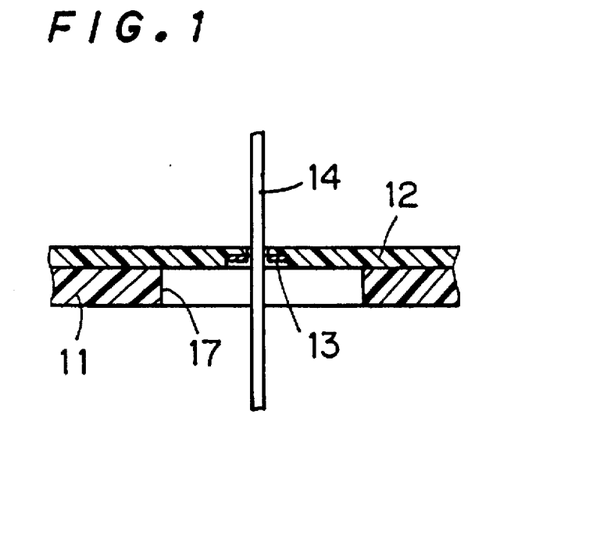
FIG. 1 is a cross-sectional view of a first preferred embodiment according to the present invention.
Figure 2:
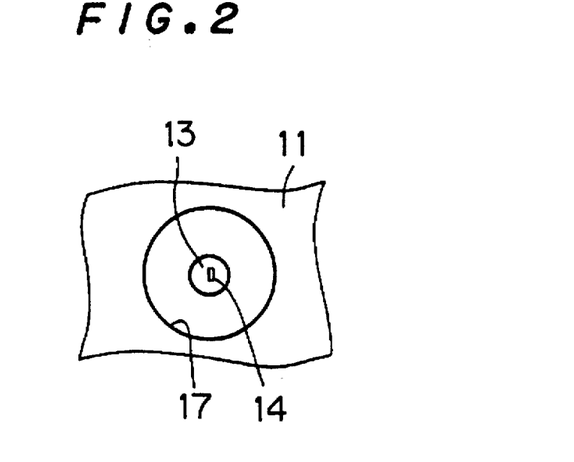
FIG. 2 is a bottom view of the first preferred embodiment.

Referring to FIGS. 1 and 2, an opening 17 is formed in a 2.6-mm thick, flat thermal insulation holder 11 including a phenolic paper base copper clad laminate board, a paper base epoxy resin board, or a glass fabric base epoxy resin board and to be brought into contact with a surface of an FPC 12 made of PET to which solder is applied. The opening 17 is greater in size than a land 13 formed on the FPC 12 and has a rectangular configuration in vertical section.

Preferably, the size of the opening 17 is about 2 to 3.5 times the area of the land 13.

The thermal insulation holder 11 is brought into contact with the solder-applied surface of the FPC 12 so that the land 13 and a terminal 14 made of a conductive material are located within the opening 17. With the contact maintained, soldering is performed by using the flow soldering or reflow soldering technique to mount the terminal 14 to the FPC 12.

The opening 17 in the thermal insulation holder 11 is greater than the land 13 on the FPC 12 to permit molten solder to readily reach the land 13 through the opening 17 without the need to form the opening 17 into the conventional trapezoidal configuration in vertical section, insuring prevention of the occurrence of poor soldering.

Additionally, there is no need to work the opening 17 into the conventional trapezoidal configuration in vertical section. This simplifies the step of forming the opening 17 in the thermal insulation holder 11.

(Second Preferred Embodiment)

Figure 3:
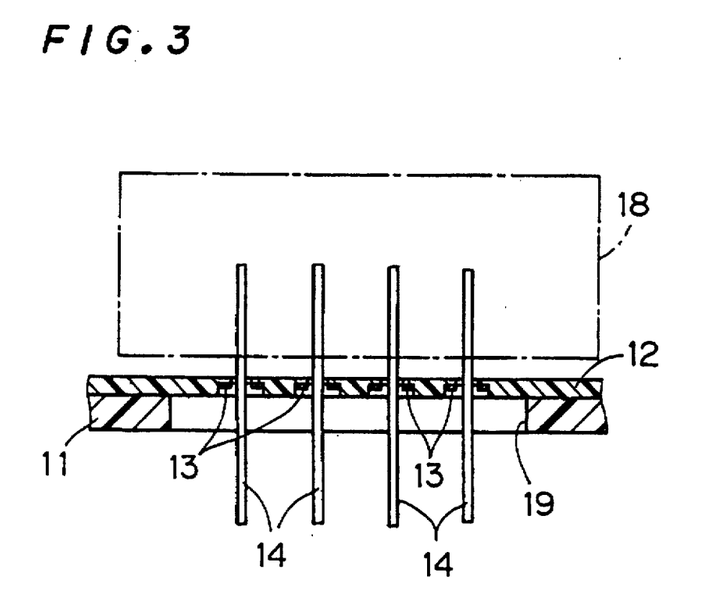
FIG. 3 is a cross-sectional view of a second preferred embodiment according to the present invention.
Figure 4:
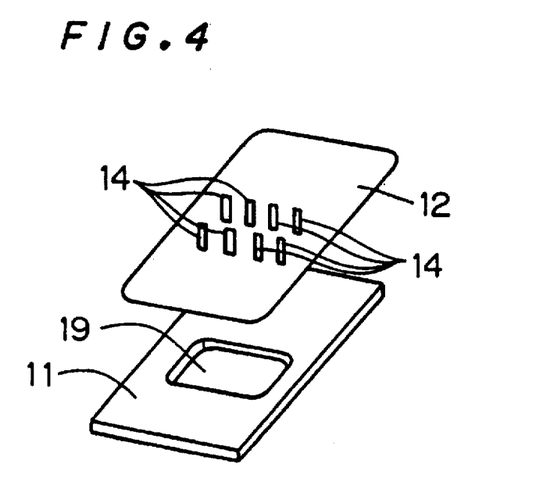
FIG. 4 is a perspective view of the second preferred embodiment.
Figure 5:
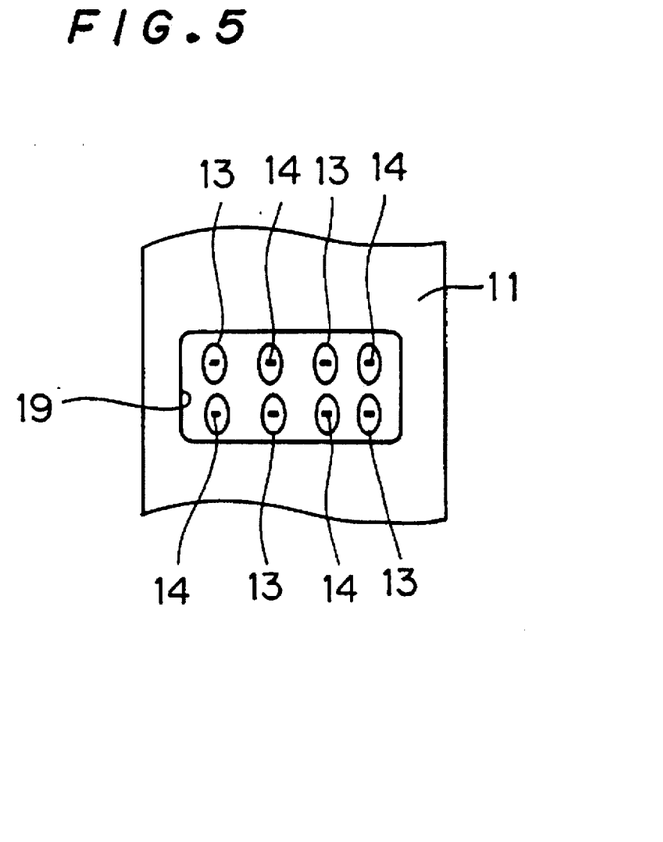
FIG. 5 is a bottom view of the second preferred embodiment.

Referring to FIGS. 3 to 5, the present invention may be applied to the soldering of a plurality of terminals 14 mounted to a connector housing 18. Formed in the thermal insulation holder 11 is a rectangular opening 19 slightly greater than a minimum rectangle defined to surround rows of lands 13.

In this manner, the formation of the opening 19 slightly greater than the minimum rectangle defined to surround the rows of lands 13 insures the soldering of the plurality of connector terminals 14 to the FPC 12 by using the flow soldering or reflow soldering technique. The need to form an opening for each connector terminal in the conventional manner is eliminated, but only one opening 19 is required for the plurality of connector terminals 14. This simplifies the step of forming the opening 19.

(Third Preferred Embodiment)

Figure 6:
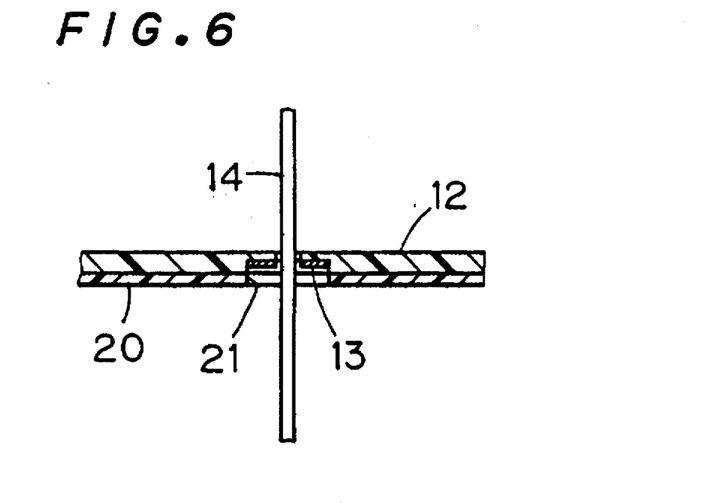
FIG. 6 is a cross-sectional view of a third preferred embodiment according to the present invention.

Referring to FIG. 6, a thinner thermal insulation holder 20 is employed in place of the 2.6-mm thick thermal insulation holder 11 of FIG. 1 in the third preferred embodiment. More specifically, the thermal insulation holder 20 has a thickness ranging from 35 µm to 2 mm which is about one-tenth to seven times the thickness of the FPC 12. An opening 21 having a size substantially equal to the land 13 on the FPC 12 is formed in the thermal insulation holder 20.

The thickness of the FPC 12 is typically about 300 µm. As compared with the thermal insulation holder 11 of FIG. 1 having the 2.6 mm thickness relative to the FPC 12, the third preferred embodiment employs the thermal insulation holder 20 having the thickness ranging from 35 µm to 2 mm which is about one-tenth to seven times the thickness of the FPC 12. Since the FPC 12 is not supported by the thermal insulation holder 20 having a thickness less than 35 µm, the thickness of the thermal insulation holder 20 is not less than 35 µm.

The opening 21 is not of trapezoidal configuration in vertical section such as the opening 5 of FIG. 13 but of rectangular configuration.

The thickness of the thermal insulation holder 20 which is about one-tenth to seven times the thickness of the FPC 12 provides a shorter distance between the surface of the molten solder and the land 13 than that of FIG. 1 to permit the molten solder to readily reach the land 13 through the opening 21, preventing the occurrence of poor soldering. Further, the size of the opening 21 need not be greater than that of the land 13 but may be substantially equal thereto.

(Fourth Preferred Embodiment)

Figure 7:
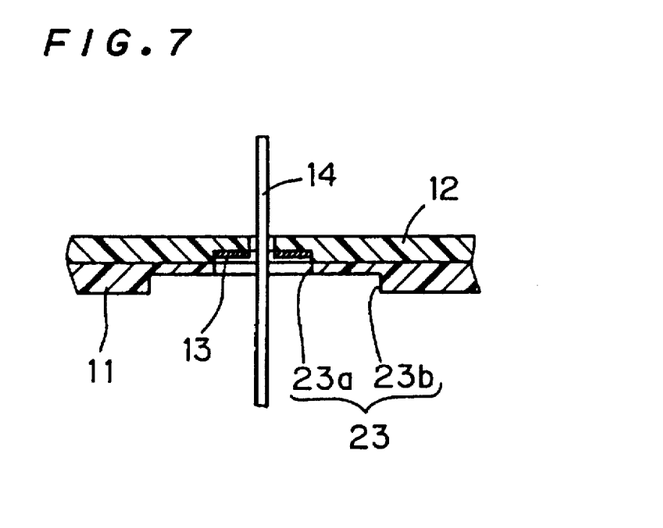
FIG. 7 is a cross-sectional view of a fourth preferred embodiment according to the present invention.

With reference to FIG. 7, a first opening 23a is formed in a surface of the thermal insulation holder 11 which contacts the FPC 12. The first opening 23a is substantially equal in size to the land 13 and extends to a depth of about one-tenth to seven times the thickness of the FPC 12, that is, to a mid-position in the direction of the thickness of the thermal insulation holder 11. A second opening 23b is formed in the opposite surface of the thermal insulation holder 11 from the surface thereof contacting the FPC 12. The second opening 23b has a size of about 2 to 3.5 times the area of the land 13 and is formed in communication with the first opening 23a. The first and second openings 23a and 23b form an opening 23 stepped in vertical section in the thermal insulation holder 11.

The stepped opening 23 in vertical section formed in the thermal insulation holder 11 permits the molten solder to readily reach the land 13 through the opening 23 as in the first preferred embodiment, insuring prevention of the occurrence of poor soldering.

Alternatively, an opening having a size of 2 to 3.5 times the area of the land 13 may be formed in the thermal insulation holder 11 having a thickness of about one-tenth to seven times that of the FPC 12.

(Fifth Preferred Embodiment)

Figure 8:
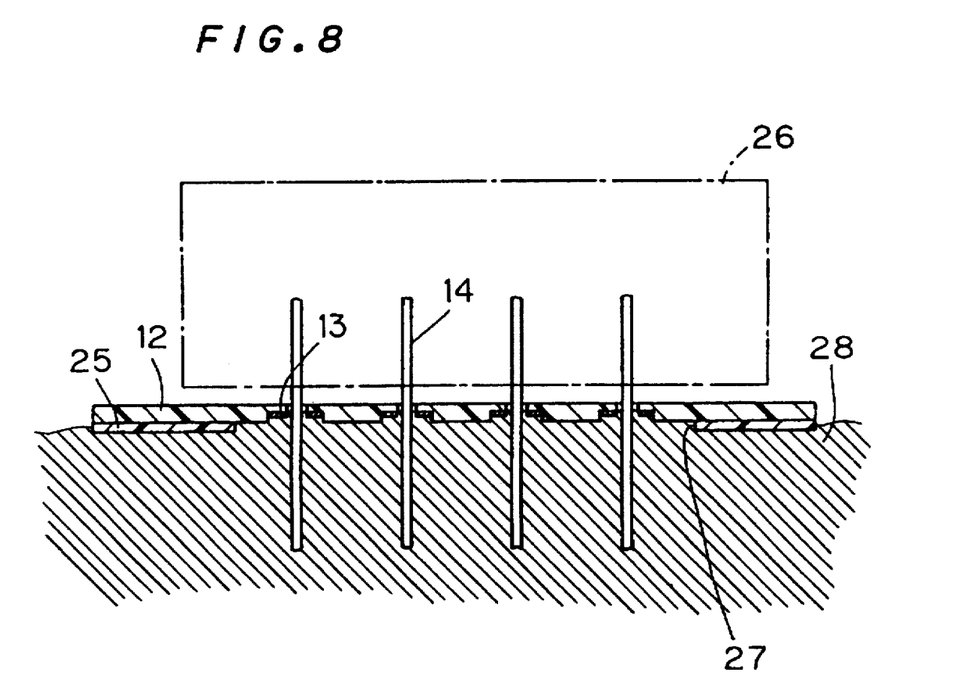
FIG. 8 is a cross-sectional view of a fifth preferred embodiment according to the present invention.

As shown in FIG. 8, the plurality of terminals 14 mounted to a connector housing 26 are soldered in a similar manner to the second preferred embodiment. A thermal insulation holder 25 for use in the soldering has a thickness ranging from 30 µm to 2 mm which is about one-tenth to seven times the thickness of the FPC 12. Formed in the thermal insulation holder 25 is a rectangular opening 27 slightly greater than a minimum rectangle defined to surround rows of lands 13.

This allows molten solder 28 to readily reach the lands 13.

Thus, like the second preferred embodiment, the fifth preferred embodiment insures soldering of the plurality of connector terminals 14 to the FPC 12 by using the flow soldering or reflow soldering technique.

The present invention is similarly applicable to the soldering of leads of a device in place of the terminals.

(Sixth Preferred Embodiment)

Figure 9:
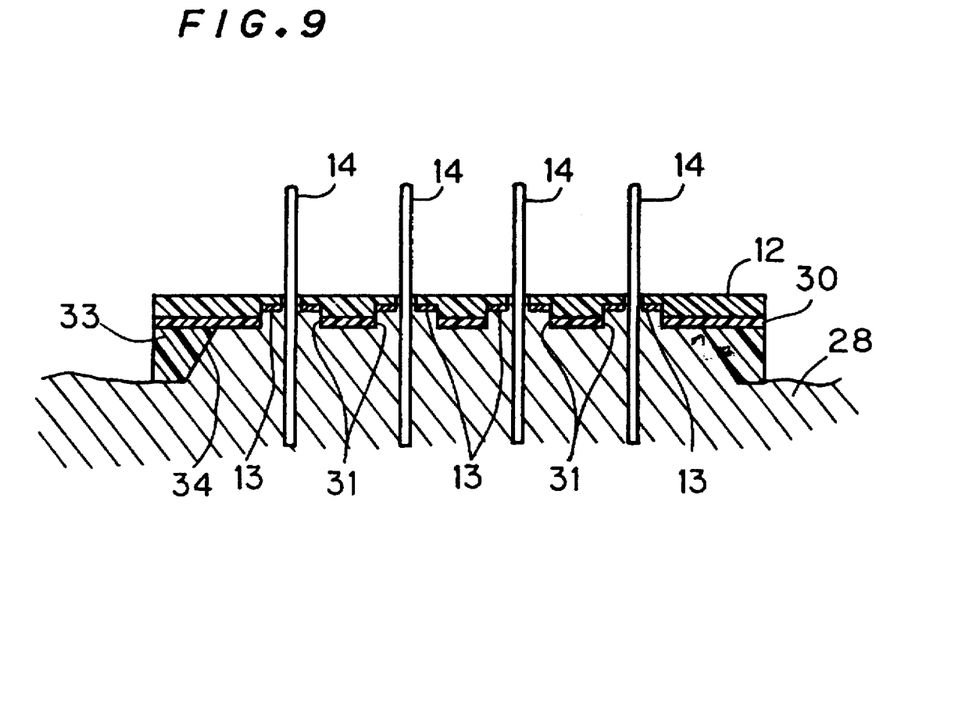
FIG. 9 is a cross-sectional view of a sixth preferred embodiment according to the present invention.
Figure 10:
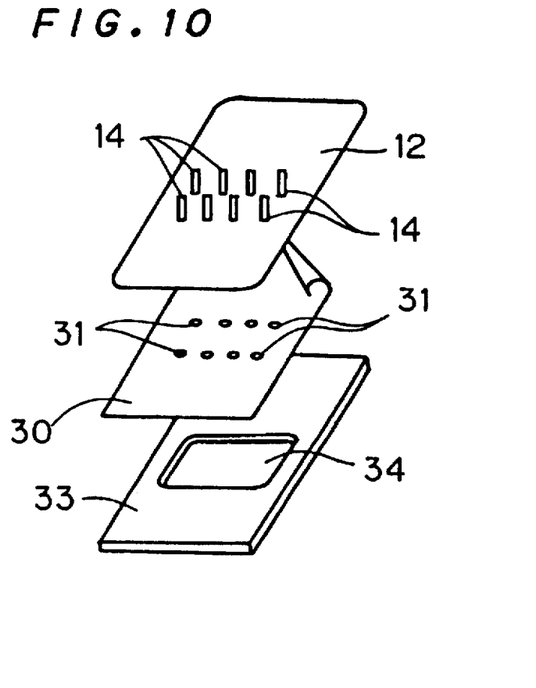
FIG. 10 is an exploded perspective view of the sixth preferred embodiment.

With reference to FIGS. 9 and 10, through apertures 31 having a size substantially equal to that of the lands 13 on the FPC 12 are formed in a thermal insulation film 30 made of a high-heat-resistant material such as polyimide, polyethylene terephthalate, polyparabanic acid, aramid, polyamide, polysulfone, polyether sulfone, polyphenylene sulfide, polyether etherketone, polyether imide, polyalylate, polyethylene naphthalate, fluorocarbon polymer or the like. The thermal insulation film 30 is provided in contact with the solder-applied surface of the FPC 12 so that the lands 13 and the terminals 14 are located within the through apertures 31. An opening 34 greater than the lands 13 are formed in a thermal insulation plate 33 including a phenolic paper base copper clad laminate board, a paper base epoxy resin board, or a glass fabric base epoxy resin board. The thermal insulation plate 33 is provided in contact with the opposite surface of the thermal insulation film 30 from the FPC 12 so that the lands 13, the terminals 14 and the through apertures 31 are located within the opening 34.

For contact between the thermal insulation plate 33 and thermal insulation film 30 and contact between the thermal insulation film 30 and FPC 12, the thermal insulation film 30 and the thermal insulation plate 33 are bonded respectively to the FPC 12 and the thermal insulation film 30 with a pressure-sensitive adhesive or an adhesive.

The molten solder 28 readily reaches the lands 13 through the opening 34 and the through apertures 31 to prevent poor soldering because of the provision of the thermal insulation film 30 in contact with the solder-applied surface of the FPC 12 so that the lands 13 and the terminals 14 are located within the through apertures 31 of the thermal insulation film 30 and the provision of the thermal insulation plate 33 in contact with the opposite surface of the thermal insulation film 30 from the FPC 12 so that the lands 13 and the terminals 14 are located within the opening 34. The provision of the thermal insulation film 30 between the FPC 12 and the thermal insulation plate 33 allows soldering by the flow soldering or reflow soldering technique without deterioration of thermal insulation effects in the case of the thin thermal insulation plate 33.

Bonding the thermal insulation film 30 and the thermal insulation plate 33 respectively to the FPC 12 and the thermal insulation film 30 with a pressure-sensitive adhesive or an adhesive facilitates the contact between the thermal insulation plate 33 and the thermal insulation film 30 and the contact between the thermal insulation film 30 and the FPC 12.

The high-heat-resistant material for the thermal insulation film 30, such as polyimide, polyethylene terephthalate, polyparabanic acid, aramid, polyamide or the like, provides for the repeated uses thereof.

(Seventh Preferred Embodiment)

Figure 11:
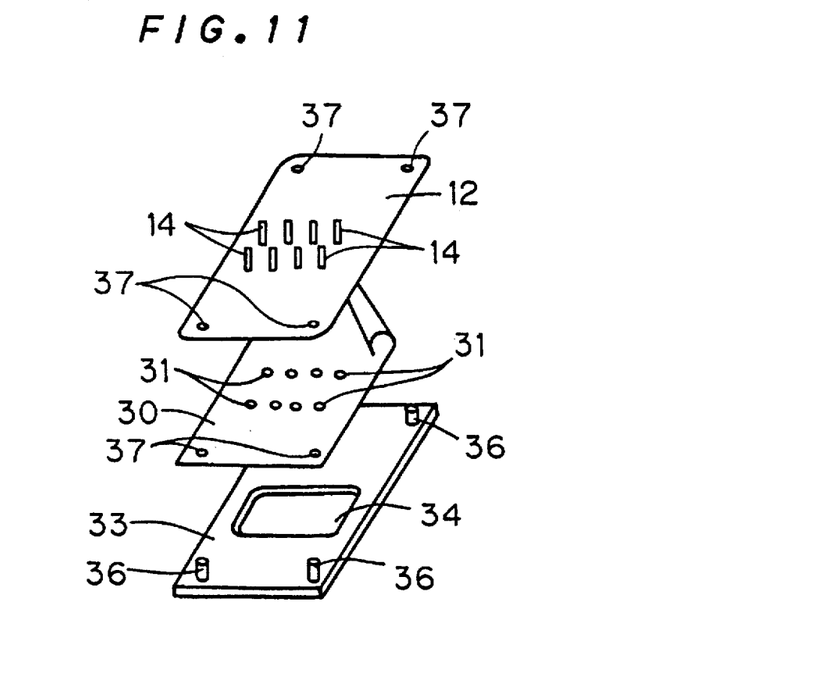
FIG. 11 is an exploded perspective view of a seventh preferred embodiment according to the present invention.

In the seventh preferred embodiment according to the present invention, as shown in FIG. 11, the thermal insulation plate 33 are implanted with guide pins 36 in four corners thereof, respectively, and through apertures 37 for the guide pins 36 are formed in the FPC 12 and the thermal insulation film 30, respectively. The contact between the thermal insulation plate 33 and the thermal insulation film 30 and the contact between the thermal insulation film 30 and the FPC 12 may be made with the guide pins 36 received through the through apertures 37. The seventh preferred embodiment provides effects similar to those of the sixth preferred embodiment.

(Eighth Preferred Embodiment)

Figure 12:
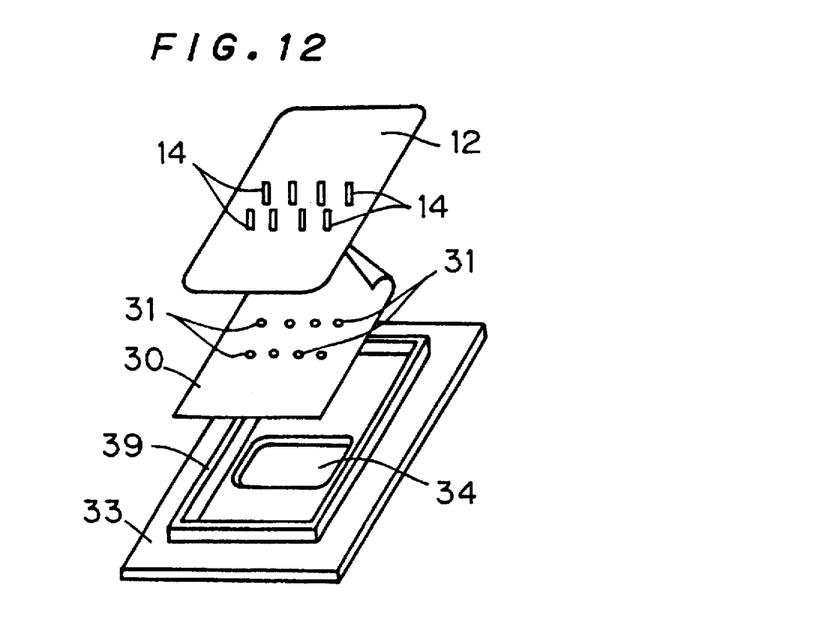
FIG. 12 is an exploded perspective view of an eighth preferred embodiment according to the present invention.

In the eighth preferred embodiment according to the present invention, as shown in FIG. 12, a guide frame 39 is formed on the thermal insulation plate 33. The guide frame 39 receives the FPC 12 and the thermal insulation film 30 therein for contact between the thermal insulation plate 33 and the thermal insulation film 30 and contact between the thermal insulation film 30 and the FPC 12.

While the invention has been described in detail, the foregoing description is in all aspects illustrative and not restrictive. It is understood that numerous other modifications and variations can be devised without departing from the scope of the invention.

I claim:

1. A method of mounting a terminal made of conductive material to a flexible printed circuit board made of a material having a softening point below 230° C. by soldering said terminal to a land on said flexible printed circuit board, said method comprising:

forming an opening larger than said land in a flat thermal insulation holder, said thermal insulation holder being adapted to contact a surface of said flexible printed circuit board to which solder is to be applied; and bringing said thermal insulation holder into contact with said surface of said flexible printed circuit board so that said land and said terminal are within said opening, and soldering said terminal to said land by flow soldering, while the contact is maintained between said thermal insulation holder and said printed circuit board.

2. The method in accordance with claim 1, wherein the thickness of said thermal insulation holder is about one-tenth to seven times the thickness of said flexible printed circuit board.

3. The method in accordance with claim 2, wherein said flexible printed circuit board is made of polyethylene terephthalate.

4. The method in accordance with claim 2, wherein said thermal insulation holder includes a phenolic paper base copper clad laminate board, a paper base epoxy resin board, or a glass fabric base epoxy resin board.

5. The method in accordance with claim 1, wherein said flexible printed circuit board is made of polyethylene terephthalate.

6. The method in accordance with claim 1, wherein said thermal insulation holder includes a phenolic paper base copper clad laminate board, a paper base epoxy resin board, or a glass fabric base epoxy resin board.

7. A method of mounting a plurality of terminals made of conductive material to a flexible printed circuit board made of a material having a softening point below 230° C. by soldering said terminals to a plurality of lands on said flexible printed circuit board, said method comprising:

forming a rectangular opening slightly larger than a minimum rectangle adapted to surround a row of said lands in a thermal insulation holder, said thermal insulation holder being adapted to contact a surface of said flexible printed circuit board to which solder is to be applied; and bringing said thermal insulation holder into contact with said surface of said flexible printed circuit board so that said lands and said terminals are located within said opening, and soldering said terminals to said lands by flow soldering while the contact is maintained between said thermal insulation holder and said printed circuit board.

8. The method in accordance with claim 7, wherein the thickness of said thermal insulation holder is about one-tenth to seven times the thickness of said flexible printed circuit board.

9. The method in accordance with claim 8, wherein said flexible printed circuit board is made of polyethylene terephthalate.

10. The method in accordance with claim 8, wherein said thermal insulation holder includes a phenolic paper base copper clad laminate board, a paper epoxy resin board, or a glass fabric base epoxy resin board.

11. The method in accordance with claim 7, wherein said flexible printed circuit board is made of polyethylene terephthalate.

12. The method in accordance with claim 7, wherein said thermal insulation holder includes a phenolic paper base copper clad laminate board, a paper base epoxy resin board, or a glass fabric base epoxy resin board.

13. A method of mounting a terminal made of conductive material to a flexible printed circuit board made of a material having a softening point below 230° C. by soldering said terminal to a land on said flexible printed circuit board, said method comprising:

forming a through aperture having a size substantially equal to the size of said land in a thermal insulation film provided in contact with a surface of said flexible printed circuit board to which solder is to be applied;

forming an opening larger than said land in a thermal insulation plate, said thermal insulation plate being adapted to contact a surface of said thermal insulation film which is opposite from said flexible printed circuit board; and soldering said terminal to said land by flow soldering while said thermal insulation film is in contact with said surface of said flexible printed circuit board so that said land and said terminal are within said through aperture and while said thermal insulation plate is in contact with said surface of said thermal insulation film so that said land and said terminal are within said opening.

14. The method in accordance with claim 13, wherein said thermal insulation plate is provided with a plurality of guide pins in corners thereof, and said flexible printed circuit board and said thermal insulation film have through apertures formed therein for said guide pins, and wherein said guide pins are respectively inserted into said through apertures to bring said thermal insulation plate into contact with said thermal insulation film and to bring said thermal insulation film into contact with said flexible printed circuit board.

15. The method in accordance with claim 14, wherein said thermal insulation film is made of polyimide, polyethylene terephthalate, polyparabanic acid, aramid, polyamide, polysulfone, polyether sulfone, polyphenylene sulfide, polyether etherketone, polyether imide, polyalylate, polyethylene naphthalate, or fluorocarbon polymer.

16. The method in accordance with claim 13, wherein said thermal insulation plate is formed with a guide frame for receiving said flexible printed circuit board and said thermal insulation film therein, and wherein said thermal insulation film comes into contact with said flexible printed circuit board, and said thermal insulation plate comes into contact with said thermal insulation film.

17. The method in accordance with claim 13, wherein said thermal insulation film is made of polyimide, polyethylene terephthalate, polyparabanic acid, aramid, polyamide, polysulfone, polyether sulfone, polyphenylene sulfide, polyether etherketone, polyether imide, polyalylate, polyethylene naphthalate, or fluorocarbon polymer.

18. The method in accordance with claim 13, wherein said thermal insulation plate includes a phenolic paper base copper clad laminate board, a paper base epoxy resin board, or a glass fabric base epoxy resin board.

19. The method in accordance with claim 13, wherein said flexible printed circuit board is made of polyethylene terephthalate.

20. The method in accordance with claim 13, wherein said thermal insulation film and said thermal insulation plate are bonded respectively to said flexible printed circuit board and said thermal insulation film with a pressure-sensitive adhesive or an adhesive.

* * * * *